United States Patent
Shin et al.

(10) Patent No.: US 12,341,063 B2
(45) Date of Patent: Jun. 24, 2025

(54) INTERCONNECT STRUCTURE, ELECTRONIC DEVICE INCLUDING THE SAME, AND METHOD OF MANUFACTURING INTERCONNECT STRUCTURE

(71) Applicant: Samsung Electronics Co., Ltd., Suwon-si (KR)

(72) Inventors: Keunwook Shin, Yongin-si (KR); Minsu Seol, Seoul (KR); Sangwon Kim, Seoul (KR); Kyung-Eun Byun, Seongnam-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 259 days.

(21) Appl. No.: 17/545,468

(22) Filed: Dec. 8, 2021

(65) Prior Publication Data
US 2022/0399228 A1    Dec. 15, 2022

(30) Foreign Application Priority Data

Jun. 11, 2021 (KR) .................. 10-2021-0076233

(51) Int. Cl.
*H01L 21/768* (2006.01)
*H01L 23/532* (2006.01)

(52) U.S. Cl.
CPC .... *H01L 21/7685* (2013.01); *H01L 23/53209* (2013.01); *H01L 23/53238* (2013.01); *H01L 23/53252* (2013.01); *H01L 23/53266* (2013.01); *H01L 21/76864* (2013.01)

(58) Field of Classification Search
None
See application file for complete search history.

(56) References Cited

U.S. PATENT DOCUMENTS

| | | | |
|---|---|---|---|
| 10,971,451 B2 | 4/2021 | Byun et al. | |
| 11,069,619 B2 | 7/2021 | Nam et al. | |
| 11,217,531 B2 | 1/2022 | Byun et al. | |
| 11,682,622 B2 | 6/2023 | Byun et al. | |
| 2012/0139114 A1* | 6/2012 | Zhang | H01L 21/76849 257/E23.168 |

(Continued)

FOREIGN PATENT DOCUMENTS

| | | |
|---|---|---|
| KR | 101633039 B1 | 6/2016 |
| KR | 20200011197 A | 2/2020 |

OTHER PUBLICATIONS

Mehta, R. et al., 'Enhanced Electrical and Thermal Conduction in Graphene-Encapsulated Copper Nanowires' *Nano Letters*, vol. 15, 2015, pp. 2024-2030.

(Continued)

*Primary Examiner* — Erik Kielin
(74) *Attorney, Agent, or Firm* — HARNESS, DICKEY & PIERCE, P.L.C.

(57) ABSTRACT

Disclosed are an interconnect structure, an electronic device including the same, and a method of manufacturing the interconnect structure. The interconnect structure includes a dielectric layer; a conductive interconnect on the dielectric layer; and a graphene cap layer on the conductive interconnect. The graphene cap layer contains graphene quantum dots, has a carbon content of 80 at % or more, and has an oxygen content of 15 at % or less.

32 Claims, 10 Drawing Sheets

(56) References Cited

U.S. PATENT DOCUMENTS

| | | |
|---|---|---|
| 2014/0106561 A1 | 4/2014 | Niyogi et al. |
| 2016/0240482 A1* | 8/2016 | Song ................. H01L 21/76852 |
| 2016/0270237 A1 | 9/2016 | Cho et al. |
| 2016/0291472 A1* | 10/2016 | Shin ........................ G03F 7/168 |
| 2019/0031906 A1* | 1/2019 | Kim ..................... C09D 165/00 |
| 2019/0161351 A1 | 5/2019 | Song et al. |
| 2020/0035602 A1* | 1/2020 | Nam ..................... H01L 23/528 |
| 2020/0035611 A1 | 1/2020 | Byun et al. |
| 2020/0071822 A1* | 3/2020 | An ..................... C23C 16/45559 |
| 2022/0157710 A1* | 5/2022 | Li ..................... H01L 21/76831 |

OTHER PUBLICATIONS

Kang, C.G. et al., 'Effects of multi-layer graphene capping on Cu interconnects' *Nanotechnology*, vol. 24, 2013, 115707.

Keun Wook Shin et al., "Low-temperature growth of nanocrystalline graphene on metal thin films", Materials Chemistry and Physics, vol. 318, 2024, 129280, ISSN 0254-0584, https://doi.org/10.1016/j.matchemphys.2024.129280.

"Reduced graphene oxide: an introduction", Retrieved from Graphene-info <https://www.graphene-info.com/reduced-graphene-oxide-introduction> on Feb. 3, 2025.

* cited by examiner

INTERCONNECT STRUCTURE, ELECTRONIC DEVICE INCLUDING THE SAME, AND METHOD OF MANUFACTURING INTERCONNECT STRUCTURE

CROSS-REFERENCE TO RELATED APPLICATION

This application is based on and claims priority under 35 U.S.C. § 119 to Korean Patent Application No. 10-2021-0076233, filed on Jun. 11, 2021 in the Korean Intellectual Property Office, the disclosure of which is incorporated by reference herein in its entirety.

BACKGROUND

1. Field

The present disclosure relates to interconnect structures, electronic devices including the same, and/or methods of manufacturing the interconnect structures.

2. Description of the Related Art

Recently, the sizes of semiconductor devices gradually have been reduced in order to achieve high integration of the semiconductor devices. For this purpose, in an interconnect structure, it may be necessary to reduce the line width of a conductive interconnect made of a metal or a metal alloy. Meanwhile, when the line width of the conductive interconnect is reduced, current density in the conductive interconnect may increase; consequently, resistance of the conductive interconnect may increase. Such an increase in resistance of the conductive interconnect may cause electromigration of metal or metal alloy atoms constituting the conductive interconnect, thereby causing defects in the conductive interconnect. Therefore, it may be necessary to provide a cap layer for lowering the resistance of the conductive interconnect. Simultaneously, in the process of manufacturing the interconnect structure, it may be necessary for electrical characteristics to be maintained without changing the composition of the cap layer and changing the dielectric constant of a dielectric layer.

SUMMARY

Provided are interconnect structures capable of reducing the resistance of a conductive interconnect and limiting and/or preventing the deterioration of electrical characteristics by maintaining the dielectric constant of a dielectric layer without changing the composition of a cap layer.

Provided are electronic devices including the interconnect structures.

Provided are methods of manufacturing the interconnect structures.

Additional aspects will be set forth in part in the description that follows and, in part, will be apparent from the description, or may be learned by practice of the presented embodiments of the disclosure.

According to an embodiment, an interconnect structure includes a dielectric layer; a conductive interconnect on the dielectric layer; and a graphene cap layer on the conductive interconnect. The graphene cap layer contains graphene quantum dots, and has a carbon content of 80 at % or more and an oxygen content of 15 at % or less.

In some embodiments, the graphene quantum dots may have a ratio of carbon having an $sp^2$ bond to carbon having an $sp^3$ bond of 1 or more.

In some embodiments, the graphene quantum dots may have an average grain size of about 1 nm to about 10 nm.

In some embodiments, the graphene cap layer may have a thickness of about 1 nm to about 20 nm.

In some embodiments, the graphene cap layer, when measuring Raman spectra, may have an intensity ratio of a D band peak to a G band peak of 2 or less.

In some embodiments, the graphene cap layer, when measuring Raman spectra, may have an intensity ratio of a 2D band peak to a G band peak of 0.01 or more.

In some embodiments, the conductive interconnect may include at least one metal selected from Cu, Ru, Rh, Ir, Mo, W, Pd, Pt, Co, Ta, and Ti, or an alloy thereof.

In some embodiments, the dielectric layer may surround a side surface of the conductive interconnect and the graphene cap layer may be exposed on an upper surface of the conductive interconnect.

In some embodiments, the graphene cap layer may cover an upper surface of the dielectric layer.

In some embodiments, the interconnect structure may further include a barrier layer between the dielectric layer and the conductive interconnect.

In some embodiments, the interconnect structure may further include a liner layer between the conductive interconnect and the barrier layer.

In some embodiments, the interconnect structure may further include a dielectric layer surrounding side surfaces of the conductive interconnect, the liner layer, and the barrier layer. The graphene cap layer may be exposed on the upper surface of the conductive interconnect.

In some embodiments, the interconnect structure may further include a dielectric layer having at least one trench formed therein; a conductive interconnect filling the at least one trench; and a graphene cap layer on at least a part of an upper surface of the conductive interconnect.

In some embodiments, the graphene cap layer may cover the upper surface of the conductive interconnect.

In some embodiments, the graphene cap layer may cover an upper surface of the dielectric layer next to the at least one trench.

In some embodiments, the interconnect structure may further include a barrier layer surrounding the conductive interconnect inside the at least one trench.

In some embodiments, the interconnect structure may further include a liner layer between the conductive interconnect and the barrier layer. The liner layer may surround the conductive interconnect inside the at least one trench.

In some embodiments, the graphene cap layer may cover the upper surface of the conductive interconnect.

In some embodiments, the graphene cap layer may cover upper surfaces of the liner layer and the barrier layer around the conductive interconnect.

In some embodiments, the graphene cap layer may cover an upper surface of the dielectric layer next to the at least one trench.

According to another embodiment, an electronic device includes a substrate and an interconnect structure on the substrate. The interconnect structure may include a dielectric layer; a conductive interconnect on the dielectric layer; and a graphene cap layer on the conductive interconnect. The graphene cap layer contains graphene quantum dots, has a carbon content of 80 at % or more, and has an oxygen content of 15 at % or less.

According to another embodiment, a method of manufacturing an interconnect structure includes preparing a dielectric layer; placing a conductive interconnect on the dielectric layer; applying a graphene-containing composition onto the conductive interconnect; and drying the graphene-containing composition to form a graphene cap layer on the conductive interconnect. The graphene cap layer contains graphene quantum dots, has a carbon content of 80 at % or more, and has an oxygen content of 15 at % or less.

In some embodiments, the graphene-containing composition may include graphene quantum dots. Each of the graphene quantum dots at an end thereof may have at least one functional group selected from a hydroxyl group, an epoxy group, a carboxyl group, an amine group, and an amide group.

In some embodiments, the graphene quantum dots may be dispersed in water, an organic polar solvent, or a combination thereof.

In some embodiments, the method may further include performing a heat treatment at a temperature of 400° C. or less in the applying the graphene-containing composition or the drying the graphene cap layer to form the graphene-cap layer.

According to an embodiment, an interconnect structure includes a dielectric layer; a graphene cap layer facing the dielectric layer, wherein the graphene cap layer contains graphene quantum dots, has a carbon content in a range of about 80 at % to about 95 at %, or has an oxygen content of about 15 at % or less; and a conductive interconnect between dielectric layer and the graphene cap layer. The conductive interconnect may be connected to the dielectric layer and the graphene cap layer.

In some embodiments, the dielectric layer may include a trench and the conductive interconnect may be in the trench.

In some embodiments, the graphene quantum dots may have an average grain size of about 1 nm to about 10 nm.

In some embodiments, the graphene cap layer may have a thickness of about 1 nm to about 20 nm.

In some embodiments, an electronic device may include the interconnect structure of claim on a substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
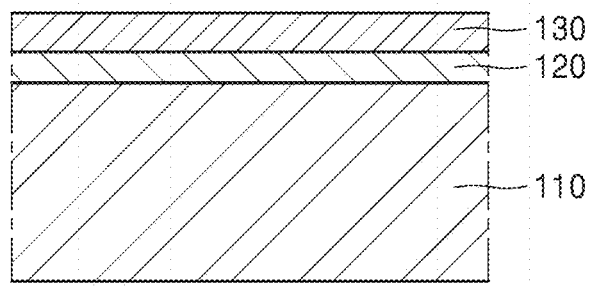
FIG. 1 is a schematic cross-sectional view of an interconnect structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Hereinafter, interconnect structures, electronic devices including the same, and methods of manufacturing the interconnect structures according to embodiments will be described in detail with reference to the accompanying drawings. These embodiments are presented merely to explain the present disclosure more specifically, and the scope of the present disclosure is not limited by these embodiments and is only defined by claims to be described later.

In the drawings, the same reference numerals refer to the same components, and the size or thickness of each component may be exaggerated for clarity of description.

As used herein, expressions such as "at least one", "at least one kind", "one or more kinds", or "one or more" when preceding a list of elements, modify the entire list of elements and do not modify the individual elements of the list. As used herein, the term "combination thereof" is used to refer to a mixture, alloy, reaction product or complexed form of one component and another component.

As used herein, the term "including" is used to indicate that other components may be added or/and interposed, rather than excluding other components, unless specifically stated to the contrary.

As used herein, unless otherwise indicated or explicitly contradicted by context, articles "a," "an," and "the" should be interpreted as including both singular and plural.

As used herein, the term "or" means "and/or" unless otherwise specified.

Throughout the present specification, "an embodiment", "example embodiment", "exemplary embodiment", etc. are included in at least one embodiment in which specific elements described in connection with the embodiment are included in this specification, which means that these elements may or may not exist in another embodiment. Further, it should be understood that the described elements may be combined in any suitable manner in various embodiments.

As used herein, the "upper" or "on" may include not only directly above in contact, but also above in a non-contact manner with intervening other elements in between. Further, it should be understood that the described elements may be combined in any suitable manner in various embodiments.

Unless otherwise defined, all terms including technical and scientific terms used herein have the same meaning as commonly understood by one of ordinary skill in the art to which this disclosure belongs. All cited patents, patent applications and other references are incorporated herein by reference in their entirety. However, if the terms in this specification contradict or conflict with the terms of the incorporated references, the terms from this specification take precedence over the conflicting terms in the incorporated reference.

While specific embodiments and implementations have been described, alternatives, modifications, variations, improvements and substantive equivalents that are currently unexpected or unforeseeable may occur to applicants or those skilled in the art. Accordingly, the appended claims and amendments are intended to include all such alternatives, modifications, improvements and substantial equivalents.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, the term "graphene quantum dot (GQD)" refers to a material made in the form of dot or sheet having a size of 50 nm or less in order to make graphene, which is a conductor material, into a semiconductor. In the graphene quantum dot, the term "graphene" is a single atomic layered sheet structure of a carbon nanostructure in which a plurality of carbon atoms are connected to each other by covalent bonds to form a polycyclic aromatic molecule arranged in one plane, a network structure in which a plurality of plate-shaped carbon nanostructures, which are small film pieces, are interconnected and arranged in one plane, or a combination thereof. The carbon atoms connected by covalent bonds form a 6-membered ring as a basic repeating unit, but may further form a 5-membered ring and/or a 7-membered ring. The graphene may consist of a plurality of layers in which a plurality of sheet structures and/or network structures are stacked on each other, and may have an average thickness of about 100 nm or less, for example, about 10 nm or less, and specifically about 0.01 nm to about 10 nm. For example, monocrystalline graphene quantum dots (GQD) may be obtained by performing a hydrothermal fusion reaction of polycyclic aromatic hydrocarbon under an aqueous alkali solution condition. In a hydrothermal fusion reaction, alkaline species such as OH— may cause hydrogen removal, condensation, graphitization, and/or edge functionalization reactions to occur. Examples of the polycyclic aromatic hydrocarbon may include pyrene and 1-nitropyrene. A nitration reaction of the polycyclic aromatic hydrocarbon may be performed prior to performing the hydrothermal fusion reaction. The nitration reaction may be performed using hot nitric acid ($HNO_3$). The resulting product of the nitration reaction may be 1,3,6-trinitropyrene. In the hydrothermal fusion reaction, an amine-based material such as $NH_3$ or $NH_2NH_2$ may be added. When such an amine-based material is added, graphene quantum dots functionalized with water-soluble OH-groups and amine groups may be obtained. Thereafter, when side-products are separated through a process such as filtering, centrifugation, or dialysis, graphene quantum dots having a desired size may be obtained.

An electronic device includes a substrate and an interconnect structure on the substrate.

FIG. 1 is a schematic cross-sectional view of an interconnect structure according to an embodiment. Referring to FIG. 1, the interconnect structure may include a dielectric layer 110, a conductive interconnect 120 on the dielectric layer 110, and a graphene cap layer 130 on the conductive interconnect 120.

The substrate may include at least one of group IV semiconductor materials, a semiconductor compound, an insulating material, and a metal. For example, the substrate may include a group IV semiconductor material such as Si, Ge, or Sn. Alternatively, for example, the substrate may include at least one of Si, Ge, C, Zn, Cd, Al, Ga, In, B, C, N, P, S, Se, As, Sb, Te Ta, Ru, Rh, Ir, Co, Ta, Ti, W, Pt, Au, Ni, and Fe. For example, the substrate may include Si, Ge, SiC, SiGe, SiGeC, a Ge alloy, GaAs, InAs, or InP. The substrate may include a single layer or a plurality of layers in which different materials are stacked.

For example, the substrate may include a silicon-on-insulator (SOI) substrate or a silicon germanium-on-insulator (SGOI) substrate. For example, the substrate may further include N or F as a SiCOH-based composition, and may include pores in order to lower a dielectric constant. Meanwhile, the substrate may further include a dopant.

The substrate may include at least one semiconductor device (not shown). For example, the semiconductor device may include at least one of a transistor, a capacitor, a diode, and a resistor. For example, the semiconductor device may be a transistor. However, examples of the semiconductor device are not limited thereto, and any semiconductor device may be used as long as it is used in the art.

A dielectric layer 110 may be formed on the substrate. The dielectric layer 110 may have a single layer structure or a plurality of layers structure in which different materials are stacked. The dielectric layer 110 may include a dielectric material used in a general semiconductor manufacturing process. The dielectric layer 110 may typically include a low-k dielectric material as an inter-metal dielectric (IMD) layer. For example, the dielectric layer 110 may include a dielectric material having a dielectric constant of about 3.6 or less, for example, about 3.3 or less, for example, about 3.0 or less. For example, the dielectric layer 110 may include $Al_2O_3$, AlN, $ZrO_2$, $HfO_x$ (0<x<4), $SiO_2$, SiCO, SiCN, SiON, SiCOH, AlSiO, or BN (boron nitride). However, the present disclosure is not limited thereto, and various other dielectric materials may be used for the dielectric layer 110. The dielectric layer 110 may include an organic dielectric material.

The conductive interconnect 120 may be disposed on the dielectric layer 110. The conductive interconnect 120 may include a metal or metal alloy having excellent electrical conductivity. For example, the conductive interconnect 120 may include at least one metal or metal alloy selected from Cu, Ru, Rh, Ir, Mo, W, Pd, Pt, Co, Ta, and Ti. The conductive interconnect 120 may have a nano-scale line width, but the line width thereof is not limited thereto.

The graphene cap layer 130 may be placed on the conductive interconnect 120. The graphene cap layer 130 may include graphene quantum dots. For example, the graphene quantum dots may be oxidized graphene quantum dots and/or reduced graphene quantum dots. At least one functional group selected from a hydroxyl group, an epoxy group, a carboxyl group, a carbonyl group, an amine group, and an amide group may be bonded to the end of the graphene quantum dot. When the above-described functional groups are bonded to the ends of the graphene quantum dots, the graphene quantum dots may be well dispersed in various kinds of polar organic solvents including water. In addition, the surfaces of the graphene quantum dots may be modified by reacting with other functional groups. The graphene cap layer may have a carbon content of 80 at % or more and an oxygen content of 15 at % or less. For example, the graphene cap layer may have a carbon content of 80 at % or more and less than 95 at % and an oxygen content of more than 5 at % and 15 at % or less. The content of carbon and the content of oxygen may be confirmed, for example, through XPS analysis. The graphene quantum dots including the above-described content of oxygen may have improved solvent dispersibility as well as improved etch resistance during etching due to high bond dissociation energy. The interconnect structure including the graphene cap layer 130 may reduce the resistance of the conductive interconnect as compared to an interconnect structure not including the graphene cap layer. Simultaneously, in the interconnect structure including the graphene cap layer 130, the low-k dielectric material of the dielectric layer 110 may not be damaged, and the deterioration of electrical properties thereof may be limited and/or prevented, unlike a conventional graphene cap layer manufactured by PE-CVD.

The graphene quantum dot includes edge carbon (Edge C) present at an edge site and center carbon (Center C) present at a center site. The edge carbon has a $sp^3$ bonding structure, and the center carbon has a $sp^2$ bonding structure. The $sp^3$ bonding structure is a three-dimensional bonding structure of carbon in the shape of a tetrahedron such as diamond, and the $sp^2$ bonding structure is a two-dimensional bonding structure of graphite. Since a functional group such as oxygen or nitrogen may be bonded to the edge carbon, the edge carbon has a greater reactivity to an etchant, compared to the center carbon. In the graphene quantum dots, a ratio of carbon having a $sp^2$ bond to carbon having a spa bond may be 1 or more, for example, 1.0 to 10. In the graphene quantum dots, a ratio of hydrogen to carbon (C/H ratio) increased, and thus resistance to etching may be secured.

The graphene quantum dots may include spherical grains. Here, the spherical shape includes all shapes that are substantially spherical and close to a sphere. For example, the spherical shape may include a sphere, an ellipse, and the like. The graphene quantum dots may have an average grain size of about 1 nm to about 10 nm. Here, the average grain size refers to D50, and represents a grain size when the graphene quantum dots having various grain sizes are accumulated up to 50% by volume. Here, the average grain size refers to an average particle diameter when the graphene quantum dots are spherical, and may indicate a length of a long major axis when the graphene quantum dots are not spherical (for example, oval or rectangular). The thickness of the graphene cap layer 130 may be about 1 nm to about 20 nm. For example, the thickness of the graphene cap layer 130 may be about 1 nm to about 10 nm, about 1 nm to about 5 nm, or about 1 nm to about 3 nm. Within the thickness range of the graphene cap layer 130, the graphene quantum dots have a stable structure.

In the graphene cap layer 130, peaks appear at about 1340 $cm^{-1}$ to about 1350 $cm^{-1}$, about 1580 $cm^{-1}$, and about 2700 $cm^{-1}$ when measuring Raman spectra. These peaks provide information about the thickness, crystallinity and charge doping state of graphene quantum dots. The peak appearing at about 1580 $cm^{-1}$ is a peak called "G-band", which is attributed to the vibrational band corresponding to the stretching of a carbon-carbon bond. The energy of the "G-band" is determined by the density of excess charge doped into graphene quantum dots. The peak appearing at about 1340 $cm^{-1}$ to about 1350 $cm^{-1}$ is a peak called "D-band", which appears when there is a defect in the $sp^2$ crystal structure. This peak is mainly observed around a sample or when there are many defects in the sample. The peak appearing at about 2700 $cm^{-1}$ is a peak called "2D-band", which is useful for evaluating the thickness of graphene quantum dots.

In the graphene cap layer 130, when measuring Raman spectra, an intensity ratio of a D band peak to a G band peak may be 2 or less. For example, the intensity ratio thereof may be about 0.001 to about 2.0.

In the graphene cap layer 130, when measuring Raman spectra, an intensity ratio of a 2D band peak to a G band peak may be 0.01 or more. For example, the intensity ratio thereof may be about 0.01 to about 1 or about 0.05 to about 0.5.

Figure 2:
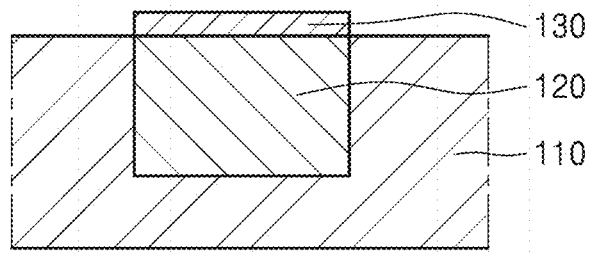
FIG. 2 is a schematic cross-sectional view of an interconnect structure according to another embodiment.
Figure 3:
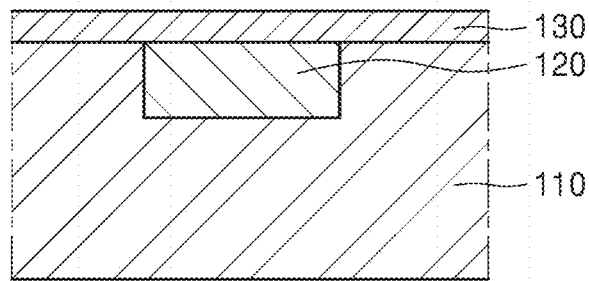
FIG. 3 is a schematic cross-sectional view of an interconnect structure according to another embodiment.

FIG. 2 is a schematic cross-sectional view of an interconnect structure according to another embodiment. FIG. 3 is a schematic cross-sectional view of an interconnect structure according to another embodiment. Referring to FIG. 2, the interconnect structure includes a dielectric layer 110 disposed to surround the side surface of the conductive interconnect 120, and the graphene cap layer 130 is exposed on the upper surface of the conductive interconnect 120.

Referring to FIG. 3, in the interconnect structure of FIG. 2, the graphene cap layer 130 covers the upper surface of the dielectric layer 110. In an electronic device, when the graphene cap layer 130 is disposed on a surface including the upper surface of the conductive interconnect 120, the resistance of the conductive interconnect 120 may be reduced by about 20%, compared to when the graphene cap layer 130 is not disposed on the upper surface of the conductive interconnect 120. Further, since a defect is not generated in the conductive interconnect 120 and the low-k dielectric material of the dielectric layer 110 is not damaged, deterioration of electrical characteristics of the interconnect structure may be limited and/or prevented.

The interconnect structure may further include a barrier layer between the dielectric layer 110 and the conductive interconnect 120. The barrier layer may be formed through a deposition process including chemical vapor deposition (CVD), plasma chemical vapor deposition (PECVD), physical vapor deposition (PVD), atomic layer deposition (ALD), sputtering, and plating used in a general semiconductor manufacturing process. For example, the barrier layer may include a metal, a metal alloy, or a metal nitride. For example, the barrier layer may include a conductive material such as Ti, Ta, Ru, W, Ir, RuTa, IrTa, TiN, TaN, RuN, RuTaN, IrTaN, WN, or graphene. However, the present disclosure is not limited thereto. The barrier layer may have a single-layer structure or a multi-layer structure in which different materials are stacked. The thickness of the barrier layer may vary depending on the material used as well as the deposition process. For example, the barrier layer may have a thickness of about 1 nm to about 40 nm.

The interconnect structure may further include a liner layer between the conductive interconnect 120 and the barrier layer. The liner layer may be formed through a deposition process including chemical vapor deposition (CVD), plasma chemical vapor deposition (PECVD), physical vapor deposition (PVD), atomic layer deposition (ALD), sputtering, and plating used in a general semiconductor manufacturing process. For example, the liner layer may include a metal, a metal alloy, or a metal nitride. For example, the liner layer may include Ta, Ti, Co, TaN, Ti(Si)N, or W. However, the present disclosure is not limited thereto. The liner layer may have a single-layer structure or a multi-layer structure in which different materials are stacked. The thickness of the liner layer may vary depending on the material used as well as the deposition process. For example, the liner layer may have a thickness of about 1 nm to about 40 nm.

The interconnect structure according to an embodiment may further include a dielectric layer 110 disposed to surround the side surfaces of the conductive interconnect 120, the liner layer, and the barrier layer, and the graphene cap layer 130 may be exposed on the upper surface of the conductive interconnect 120.

The interconnect structure according to an embodiment may include a dielectric layer 110 provided with at least one trench, a conductive interconnect 120 disposed to fill the trench, and a graphene cap layer 130 disposed on at least a part of the upper surface of the conductive interconnect 120. The graphene cap layer 130 may be disposed such that the trench covers the upper surface of the conductive interconnect 120. The graphene cap layer 130 may be disposed to additionally cover the upper surface of the dielectric layer 110 not provided with the trench.

FIGS. 4 to 7 are cross-sectional schematic views of interconnect structures according to other embodiments, respectively. The interconnect structure includes a dielectric layer 110, a barrier layer 111, a liner layer 112, a conductive interconnect 120, and a graphene cap layer 130. The interconnect structure may be a single damascene structure or a double damascene structure, but is not limited thereto.

In the interconnect structure, at least one trench is formed in the dielectric layer 110 to a desired and/or alternatively predetermined depth. As a method of forming such a trench, for example, a photolithography process and an etching process such as reactive ion etching (RIE) may be used. The trench may be formed not to contact the substrate or may be formed to contact the substrate. FIGS. 4 to 7 illustrate a case in which one trench is formed in the dielectric layer 110 and is formed so as not to contact the substrate.

The barrier layer 111 is deposited on the inner wall and bottom of the trench, and the liner layer 112 is deposited on the surface of the barrier layer 111. The conductive interconnect 120 is formed on the surface of the liner layer 112 to fill the inside of the trench. As a method of forming the conductive interconnect 120, chemical vapor deposition (CVD), plasma chemical vapor deposition (PECVD), physical vapor deposition (PVD), atomic layer deposition (ALD), sputtering, and electroplating, chemical solution deposition, or electroless plating may be used. Meanwhile, when the conductive interconnect 120 is formed through electroplating, a plating seed layer for promoting electroplating may be formed on the surface of the liner layer 112 before the conductive interconnect 120 is formed. The plating seed layer may include, for example, Cu, a Cu alloy, an Ir alloy, Ru, or a Ru alloy, but is not limited thereto. Then, the upper surface of the dielectric layer 110, the upper surface of the barrier layer 111, the upper surface of the liner layer 112, and the upper surface of the conductive interconnect 120 are processed to be the same plane through a planarization process. Here, examples of the planarization process may include, but are not limited to, a chemical mechanical polishing (CMP) process and a grinding process.

Figure 4:
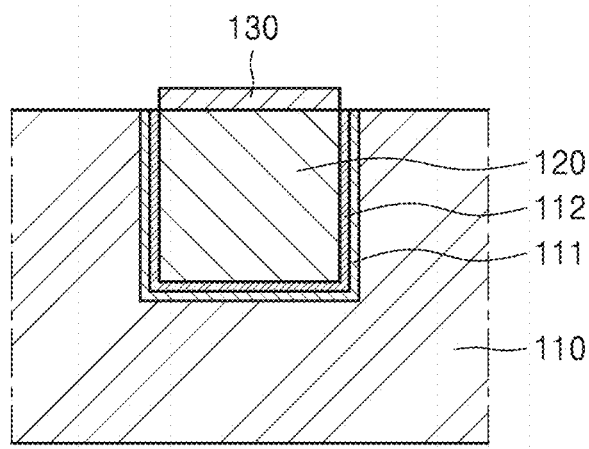
FIG. 4 is a schematic cross-sectional view of an interconnect structure according to another embodiment.

Referring to FIG. 4, the interconnect structure includes a graphene cap layer 130 disposed to cover the upper surface of the conductive interconnect 120.

Figure 5:
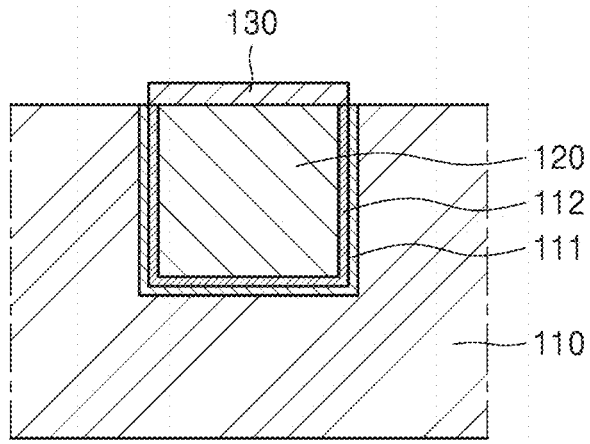
FIG. 5 is a schematic cross-sectional view of an interconnect structure according to another embodiment.

Referring to FIG. 5, the interconnect structure includes a graphene cap layer 130 disposed to cover the upper surface of the conductive interconnect 120 and the upper surface of the liner layer 112 around the conductive interconnect 120.

Figure 6:
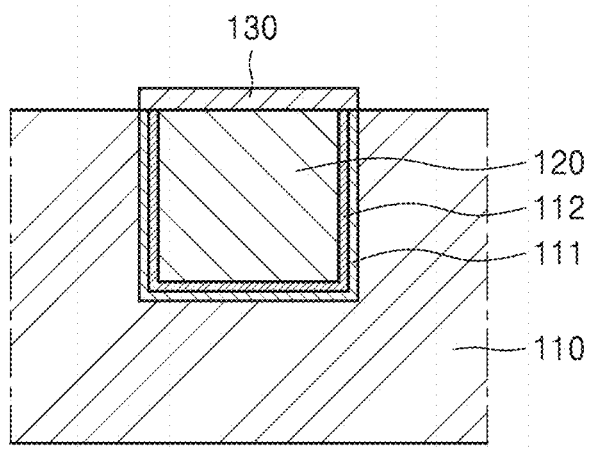
FIG. 6 is a schematic cross-sectional view of an interconnect structure according to another embodiment.

Referring to FIG. 6, the interconnect structure includes a graphene cap layer 130 disposed to cover the upper surface of the conductive interconnect 120 and the upper surfaces of the liner layer 112 and the barrier layer 111 around the conductive interconnect 120.

Figure 7:
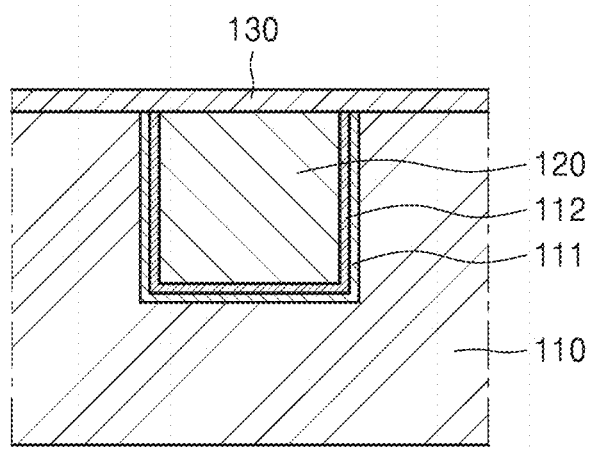
FIG. 7 is a schematic cross-sectional view of an interconnect structure according to another embodiment.

Referring to FIG. 7, the interconnect structure includes a graphene cap layer 130 disposed to additionally cover the upper surface of the conductive interconnect 120, the upper surfaces of the liner layer 112 and the barrier layer 111 around the conductive interconnect 120, and the upper surface of the dielectric layer 110 not provided with the trench.

A method of manufacturing the interconnect structure includes: preparing a dielectric layer 110; placing a conductive interconnect 120 on the dielectric layer 110; applying a graphene-containing composition onto the conductive interconnect 120; and drying the graphene-containing composition to form a graphene cap layer 130 on the conductive interconnect 120, wherein the graphene cap layer 130 contains graphene quantum dots, has a carbon content of 80 at % or more and an oxygen content of 15 at % or less. For example, the graphene cap layer 130 may have a carbon content of 80 at % or more and less than 95 at % and an oxygen content of more than 5 at % and 15 at % or less. Since the process of preparing the dielectric layer 110 and the process of placing the conductive interconnect 120 on the dielectric layer 110 have been described above, a description thereof will be omitted.

Figure 8:
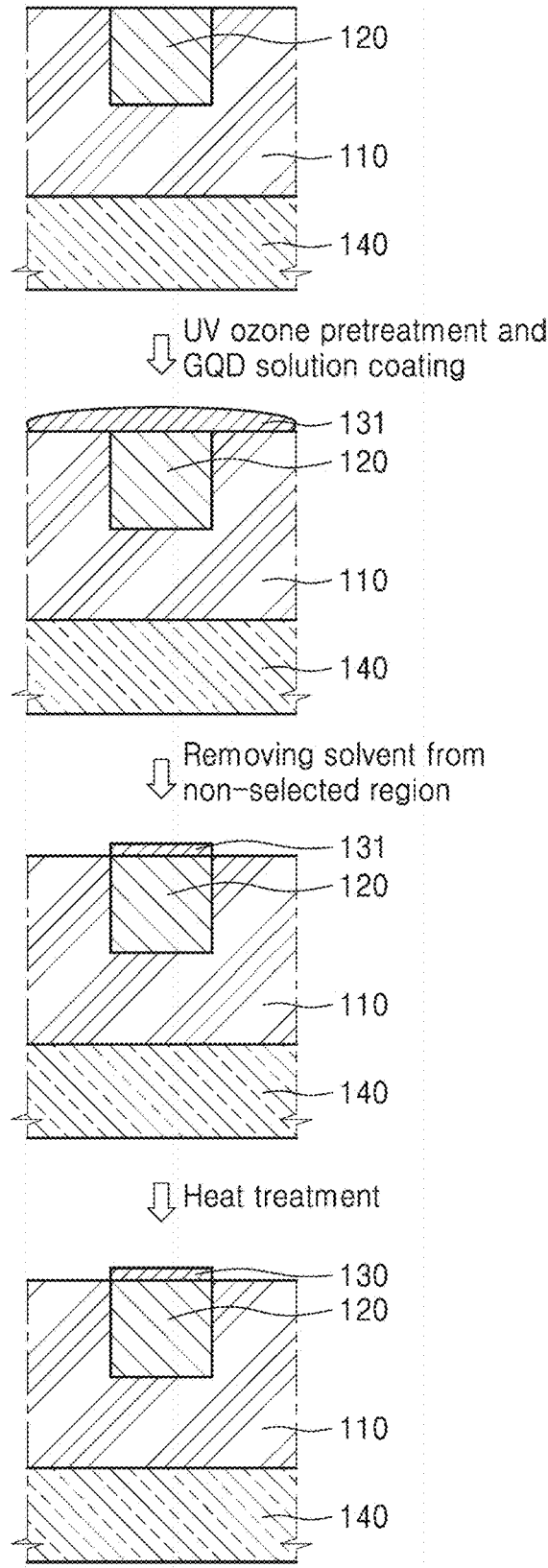
FIG. 8 is a flowchart of a method of manufacturing an electronic device including the interconnect structure according to an embodiment.

FIG. 8 is a flowchart of a method of manufacturing an electronic device including the interconnect structure according to an embodiment.

Referring to FIG. 8, a structure including a substrate 140, a dielectric layer 110 formed on the substrate 140, a trench formed in the dielectric layer 110, and a conductive interconnect 120 disposed to fill the inside of the trench is prepared.

Next, the upper surface of the conductive interconnect 120 and the upper surface of the dielectric layer 110 not provided with the trench are pre-treated by generating ozone with a UV lamp, and are coated with a graphene-containing composition, specifically, a graphene quantum dot solution. The graphene-containing composition includes graphene quantum dots each having at least one functional group selected from a hydroxyl group, an epoxy group, a carboxyl group, an amine group, and an amide group at an end thereof. The graphene-containing composition may be a composition in which the graphene quantum dots are dispersed in water, an organic polar solvent, or a combination thereof. The organic polar solvent may be at least one selected from methanol, isopropanol, ethanol, N,N-dimethylformamide, N-methylpyrrolidone, dichloroethane, dichlorobenzene, N,N-dimethylsulfoxide, xylene, aniline, propylene glycol, diacetate, methoxypropanediol, diethylene glycol, acetylacetone, cyclohexanone, propylene glycol monomethyl ether acetate, γ-butyrolactone, tetrahydrofuran, nitromethane, nitrobenzene, butyl nitrite , methyl cellosolve, ethyl cellosolve, diethyl ether, diethylene glycol methyl ether, diethylene glycol ethyl ether, dipropylene glycol methyl ether, toluene, hexane, methyl ethyl ketone, methyl isoketone, hydroxymethyl cellulose, and heptane. The content of the solvent may be about 100 parts by weight to about 100,000 parts by weight based on 100 parts by weight of the total weight of the graphene quantum dots. When the content of the solvent is within the above range, the graphene-containing composition has an appropriate viscosity to exhibit excellent film formability.

The graphene quantum dot composition may further include a catalyst. The catalyst may be a noble metal catalyst, an alloy catalyst of a noble metal and a transition metal, a semiconductor catalyst, an organic catalyst, or a mixture thereof. The noble metal catalyst may contain at least one noble metal selected from Pt, Pd, Ir, Rh, Ru, and Re, the alloy catalyst of a noble metal and a transition metal may contain an alloy of at least one noble metal selected from Pt, Pd, Ir, Rh, Ru and Re, and at least one transition metal selected from Ti, V, Mn, Cr, Fe, Ni, Co, Cu, and Zn, the semiconductor catalyst may contain an oxide of at least one selected from Si, Ge and Sn, and Si, Ge and Sn, and the organic catalyst may contain at least one amine-based compound selected from 4-(dimethylamino)pyridine (DMAP), diisopropylethylamine, pyridine, triethylamine, diisopropylethylamine (DIEA), 2,6-lutidine (2,6)-lutidine), collidine, DBN(1,5-diazabicyclo[4.3.0]non-5-ene), and DBU(1,8-diazabicyclo[5.4.0]undec-7-ene).

The coating method may be, for example, at least one selected from spin coating, air spray, electrospray, dip coating, spray coating, a doctor blade method, and bar coating.

Next, a solution in an unselected region other than the upper surface of the conductive interconnect 120 is removed by Ar blowing.

Next, the graphene-containing composition on the upper surface of the conductive interconnect 120 is dried, and heat treatment is performed at a temperature (e.g., temperature in process chamber in which heat treatment is performed) of about 400° C. or less, for example, 300° C. or less, for example, 250° C. or less for about 1 minute to about 120 minutes. As a result, a graphene cap layer 130 is formed to form an interconnect structure. The heat treatment may also be performed in the process of applying the graphene-containing composition. Meanwhile, when the graphene-containing composition further contains a catalyst, the heat treatment temperature and heat treatment time may be reduced compared to when a graphene-containing composition not containing the catalyst is used.

The interconnect structure obtained according to the above-described manufacturing method may reduce the resistance of the conductive interconnect 120 as compared to an interconnect structure not including the graphene cap layer. Simultaneously, in the interconnect structure including the graphene cap layer 130, the low-k dielectric material of the dielectric layer 110 may not be damaged, and the deterioration of electrical properties thereof may be limited and/or prevented, unlike a conventional graphene cap layer manufactured by PE-CVD.

An electronic device including an interconnect structure including a copper (Cu) conductive interconnect according to an embodiment of the present disclosure was manufactured as follows.

A silicon substrate was subjected to a pretreatment process by washing the silicon substrate with a piranha solution. An $SiO_2$ dielectric layer having a thickness of about 5 μm was deposited by thermal deposition so as to cover the washed non-patterned silicon substrate. According to the damascene method, a region in which a pattern is not formed is etched through a photolithography process on the $SiO_2$ dielectric layer, and then a photoresist remaining in the etched region is removed to form a trench. A TaN barrier layer having a thickness of about 2 nm or less and a Ta liner layer having a thickness of about 2 nm or less were sequentially deposited on the $SiO_2$ dielectric layer and the inner wall surface of the trench by physical vapor deposition. A copper seed layer is formed on the deposited Ta liner layer by physical vapor deposition, and then a copper (Cu) conductive interconnect having a thickness of about 28 nm, about 41 nm, or about 58 nm was formed by electroplating. Then, an electronic device including a dielectric layer in which one trench is formed on the non-patterned silicon substrate by performing a chemical mechanical polishing (CMP) process on the surface of the $SiO_2$ dielectric layer except for the upper surface of the trench, and an interconnect structure disposed to fill only the trench of the dielectric layer with a TaN barrier layer, a Ta liner layer, and a copper (Cu) conductive interconnect was manufactured. Separately, COOH-functionalized GQDs were mixed with N-methyl-2-pyrrolidone (NMP) and distilled water to obtain a composition in which about 15 wt % of COOH-functionalized GQDs were dispersed. The COOH-functionalized GQD-dispersed composition was applied to the upper surface of the copper (Cu) conductive interconnect by spin coating to a thickness of about 5 nm to form a layer. The residual solution around the upper surface of the copper (Cu) conductive interconnect is removed by Ar blowing of the layer, and heat treatment is performed at a temperature of 400° C., thereby manufacturing an electronic device including the interconnect structure of FIG. 4 in which a graphene cap layer is formed only on the upper surface of the copper (Cu) conductive interconnect. In some embodiments, a pretreatment process such as UV treatment may be performed on the upper surface of the copper (Cu) conductive interconnect before applying the composition in which the COOH-functionalized GQD is dispersed.

An electronic device including an interconnect structure including a tungsten (W) conductive interconnect according to an embodiment of the present disclosure was manufactured as follows.

A silicon substrate was subjected to a pretreatment process by washing the silicon substrate with a piranha solution. An $SiO_2$ dielectric layer having a thickness of about 5 μm was deposited by thermal deposition so as to cover the washed non-patterned silicon substrate. According to the damascene method, a region in which a pattern is not formed is etched through a photolithography process on the $SiO_2$ dielectric layer, and then a photoresist remaining in the etched region is removed to form a trench. A tungsten (W) conductive interconnect having a thickness of about 14 nm, about 19 nm, or about 25 nm was formed on the $SiO_2$ dielectric layer by physical vapor deposition. Then, an electronic device including a dielectric layer in which one trench is formed on the non-patterned silicon substrate by performing a chemical mechanical polishing (CMP) process on the surface of the $SiO_2$ dielectric layer except for the upper surface of the trench, and an interconnect structure disposed to fill only the trench of the dielectric layer with the tungsten (W) conductive interconnect was manufactured. Separately, COOH-functionalized GQDs were mixed with N-methyl-2-pyrrolidone (NMP) and distilled water to obtain a composition in which about 15 wt % of COOH-functionalized GQDs were dispersed. The COOH-functionalized GQD-dispersed composition was applied to the upper surface of the tungsten (W) conductive interconnect by spin coating to a thickness of about 5 nm to form a layer. The residual solution around the upper surface of the tungsten (W) conductive interconnect is removed by Ar blowing of the layer, and heat treatment is performed at a temperature of 400° C., thereby manufacturing an electronic device including the interconnect structure of FIG. 4 in which a graphene cap layer is formed only on the upper surface of the tungsten (W) conductive interconnect. In some embodiments, a pretreatment process such as UV treatment may be performed on the upper surface of the tungsten (W) conductive interconnect before applying the composition in which the COOH-functionalized GQD is dispersed.

Figure 9:
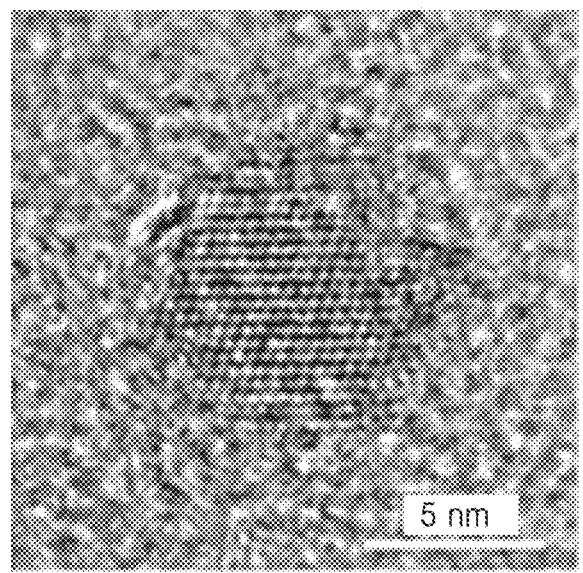
FIG. 9 is a TEM photograph of a graphene cap layer of an interconnect structure including a copper (Cu) conductive interconnect having a thickness of about 28 nm in the electronic device according to an embodiment.

FIG. 9 is a TEM photograph of a graphene cap layer of an interconnect structure including a copper (Cu) conductive interconnect having a thickness of about 28 nm in the electronic device according to an embodiment. Referring to FIG. 9, in the interconnect structure including a copper (Cu) conductive interconnect having a thickness of about 28 nm, the graphene cap layer shows mostly spherical graphene quantum dots each having a $sp^2$ bonding structure at a center site and amorphous graphene having a $sp^3$ bonding structure at an edge site. The average grain size of the graphene quantum dots was about 5 nm. The graphene cap layer was a single layer, and had a thickness of about 5 nm.

Figure 10A:
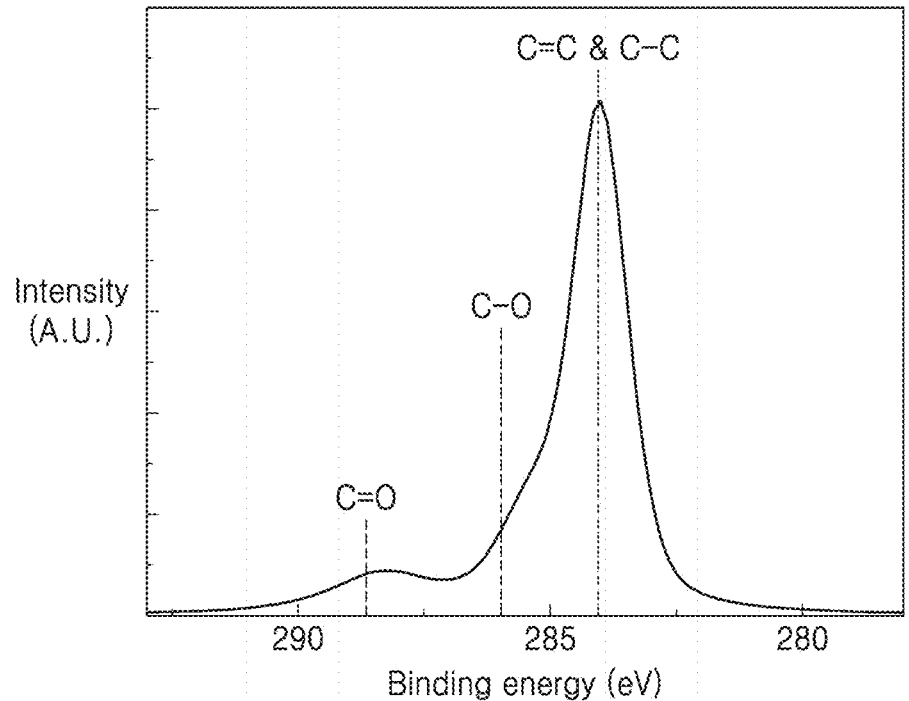
FIG. 10A is a graph showing XPS analysis results of a graphene cap layer of an interconnect structure including a copper (Cu) conductive interconnect having a thickness of about 28 nm, the graphene cap layer being formed by coating, in the electronic device according to an embodiment.

FIG. 10A is a graph showing the XPS analysis results of a graphene cap layer of an interconnect structure including a copper (Cu) conductive interconnect having a thickness of about 28 nm, the graphene cap layer being formed by coating, in the electronic device according to an embodiment. In the XPS analysis, Quantum 2000 (Physical Electronics) (acceleration voltage: 0.5 keV to 15 keV, 300 W, energy resolution: about 1.0 eV, sputter rate: 0.1 nm/min) was used.

Referring to FIG. 10A, it may be found that, in the graphene cap layer, C═C bonding and C—C bonding peaks were generated at a binding energy of about 284 eV, and C—O bonding and C═O bonding peaks were generated at binding energies of about 286 eV and about 288 eV, respectively. These results indicate that the composition of the graphene cap layer did not change during the process of manufacturing the electronic device. Further, it may be found that, in the graphene cap layer, graphene quantum dots having an $sp^2$ bonding structure are predominant by Raman analysis. From this, it may be found that, in the graphene cap layer, the ratio of carbon having a $sp^2$ bond to carbon having a $sp^3$ bond is 1 or more. The contents of element C and element O in the graphene cap layer were 80 at % and 15 at %, respectively.

Figure 10B:
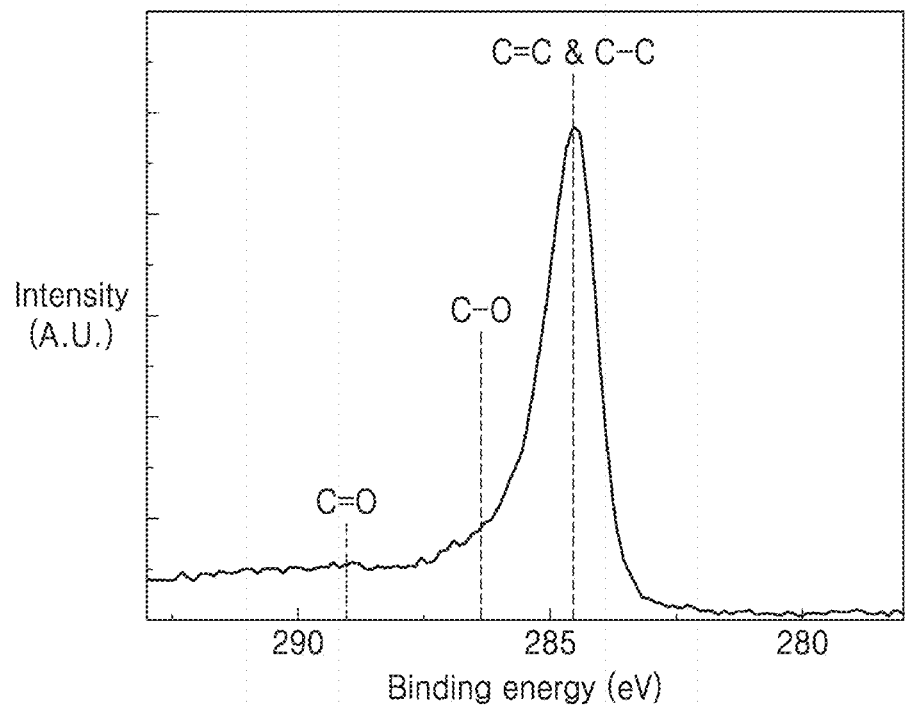
FIG. 10B is a graph showing XPS analysis results of a graphene cap layer of an interconnect structure including a copper (Cu) conductive interconnect having a thickness of about 28 nm, the graphene cap layer being formed by CVD, in the electronic device according to a comparative embodiment.

FIG. 10B is a graph showing the XPS analysis results of a graphene cap layer of an interconnect structure including a copper (Cu) conductive interconnect having a thickness of about 28 nm, the graphene cap layer being formed by CVD, in the electronic device according to a comparative embodiment; In the XPS analysis, Quantum 2000 (Physical Electronics) (acceleration voltage: 0.5 keV to 15 keV, 300 W, energy resolution: about 1.0 eV, sputter rate: 0.1 nm/min) was used. The thickness of the graphene cap layer formed by CVD was about 3 nm or less.

Referring to FIG. 10B, it may be found that, in the graphene cap layer, C═C bonding and C—C bonding peaks were generated at a binding energy of about 284 eV, but C—O bonding and C═O bonding peaks were not generated at binding energies of about 286 eV and about 288 eV, respectively. These results indicate that the composition of the graphene cap layer changed during the process of manufacturing the electronic device. Further, it may be found that, in the graphene cap layer, graphene quantum dots having an $sp^2$ bonding structure are predominant by Raman analysis. From this, it may be found that, in the graphene cap layer, the ratio of carbon having a $sp^2$ bond to carbon having a $sp^3$ bond is 1 or more. The contents of element C and element O in the graphene cap layer were 95 at % and 5 at %, respectively.

Figure 11A:
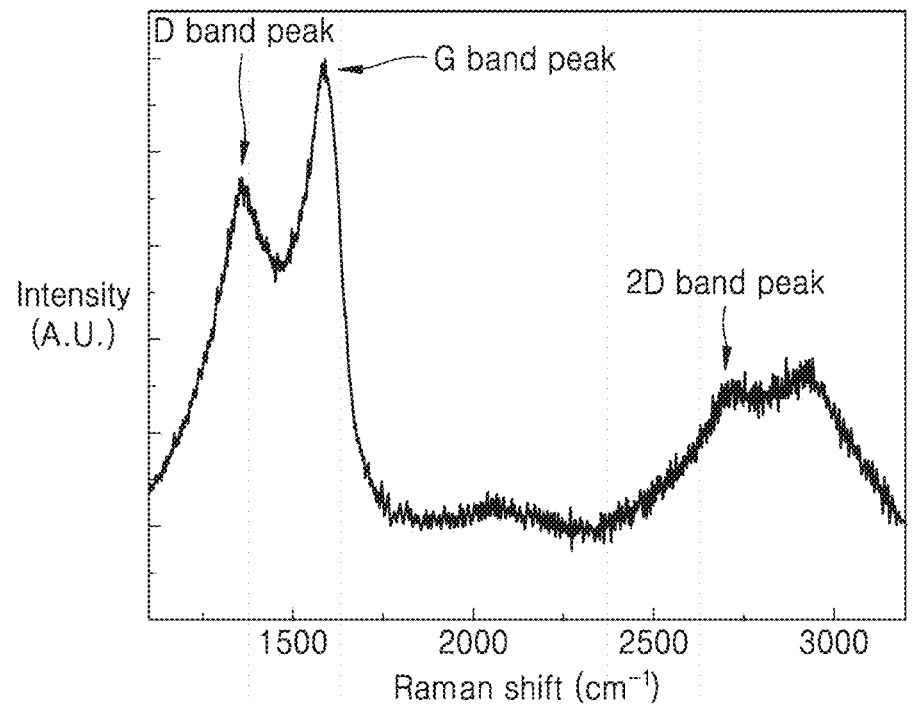
FIG. 11A is a graph showing Raman spectrum analysis results of a graphene cap layer of an interconnect structure including a copper (Cu) conductive interconnect having a thickness of about 28 nm, the graphene cap layer being formed by coating, in the electronic device according to an embodiment.

FIG. 11A is a graph showing the Raman spectrum analysis results of a graphene cap layer of an interconnect structure including a copper (Cu) conductive interconnect having a thickness of about 28 nm, the graphene cap layer being formed by coating, in the electronic device according to an embodiment.

Referring to FIG. 11A, in the graphene cap layer, peaks appeared at about 1340 $cm^{-1}$ to about 1350 $cm^{-1}$ ("D band"), about 1580 $cm^{-1}$ ("G band"), and about 2700 $cm^{-1}$ ("2D band") in the Raman analysis spectrum. In the graphene cap layer, the half width of the D-band peak was 200 $cm^{-1}$, the intensity ratio of the D-band peak to the G-band peak was 0.7, and the intensity ratio of the 2D-band peak to the G-band peak was 0.2.

Figure 11B:
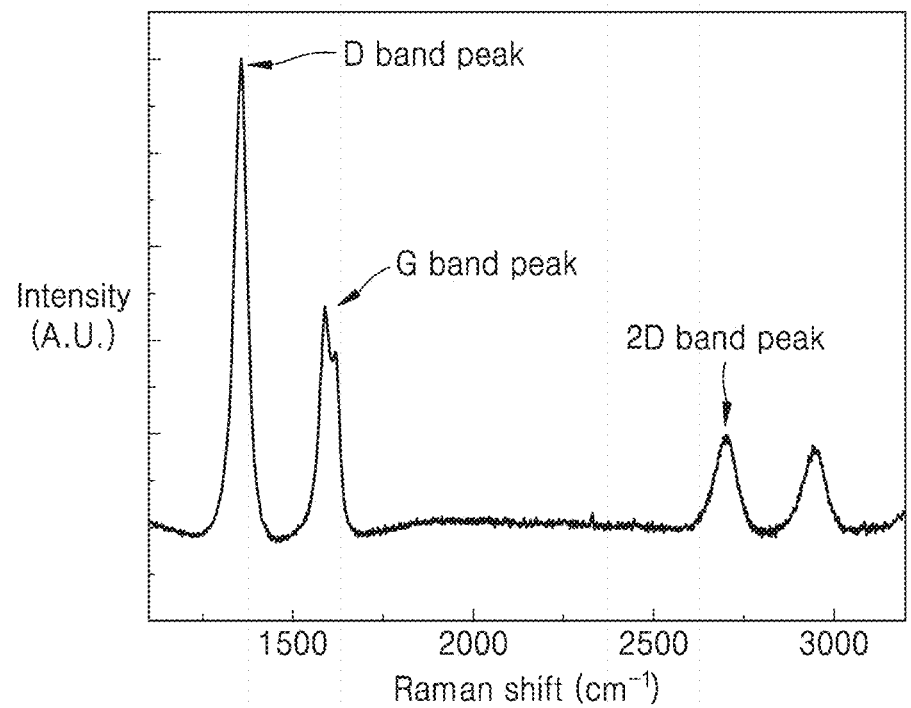
FIG. 11B is a graph showing Raman spectrum analysis results of a graphene cap layer of an interconnect structure including a copper (Cu) conductive interconnect having a thickness of about 28 nm, the graphene cap layer being formed by CVD, in the electronic device according to a comparative embodiment.

FIG. 11B is a graph showing the Raman spectrum analysis results of a graphene cap layer of an interconnect structure including a copper (Cu) conductive interconnect having a thickness of about 28 nm, the graphene cap layer being formed by CVD, in the electronic device according to a comparative embodiment.

Referring to FIG. 11B, in the graphene cap layer, D band, G band, and 2D band appeared in the Raman analysis spectrum. In the graphene cap layer, the half width of the D-band peak was 42 $cm^{-1}$, the intensity ratio of the D-band peak to the G-band peak was 2.2, and the intensity ratio of the 2D-band peak to the G-band peak was 0.4. From this, it may be found that the graphene quantum dots included in the graphene cap layer formed by CVD have more $sp^3$ bonds, and the crystal size thereof is smaller than that of the graphene quantum dots in the graphene cap layer formed by coating according to an embodiment of the present disclosure.

Figure 12:
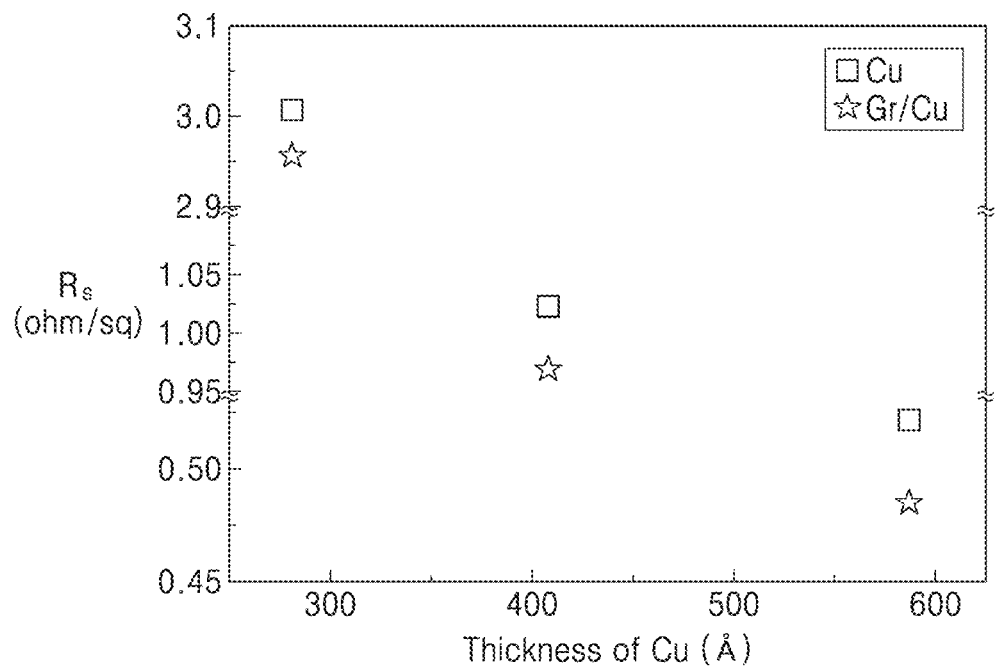
FIG. 12 is a graph showing analysis results of surface resistance of an interconnect structure with respect to the thickness (about 28 nm, about 41 nm, or about 58 nm) of a copper (Cu) conductive interconnect before and after the formation of a graphene cap layer in the electronic device according to an embodiment.
Figure 13:
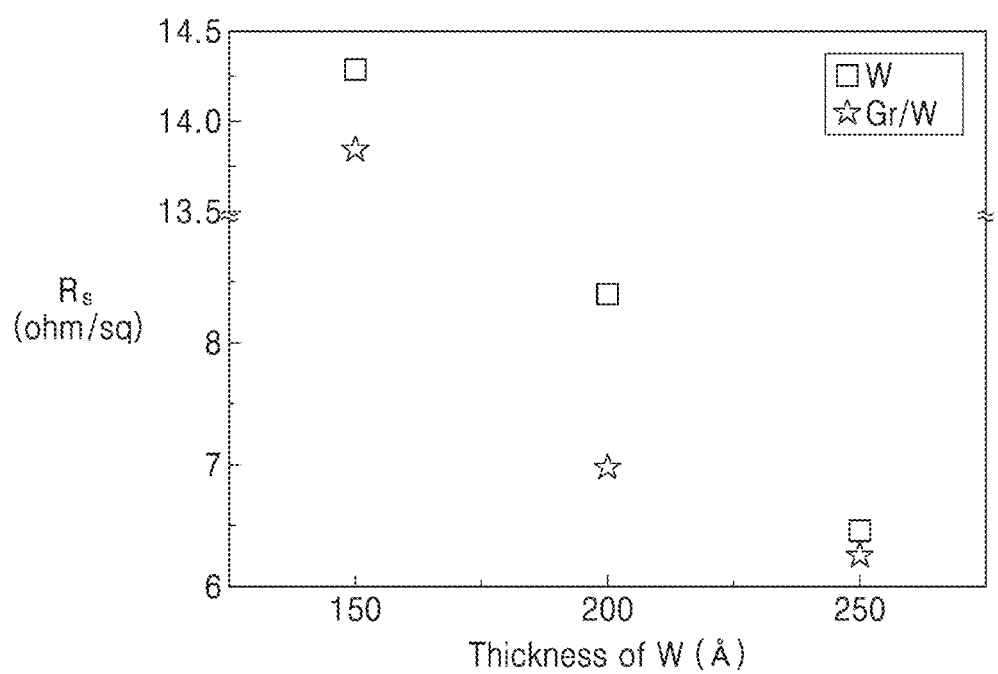
FIG. 13 is a graph showing the analysis results of surface resistance of an interconnect structure with respect to the thickness (about 14 nm, about 19 nm, or about 25 nm) of a tungsten (W) conductive interconnect before and after the formation of a graphene cap layer in the electronic device according to another embodiment.

FIG. 12 is a graph showing the analysis results of surface resistance of an interconnect structure with respect to the thickness (about 28 nm, about 41 nm, or about 58 nm) of a copper (Cu) conductive interconnect before and after the formation of a graphene cap layer in the electronic device according to an embodiment; and FIG. 13 is a graph showing the analysis results of surface resistance of an interconnect structure with respect to the thickness (about 14 nm, about 19 nm, or about 25 nm) of a tungsten (W) conductive interconnect before and after the formation of a graphene cap layer in the electronic device according to another embodiment. Surface resistance was analyzed using a 4-probe measurement method (Loresta EP MCP-T360).

Referring to FIGS. 12 and 13, it may be found that, in all of the electronic devices, after the formation of the graphene cap layer, the surface resistance of the interconnect structure is reduced by about 1.7% to about 17%, compared to before the formation of the graphene cap layer.

An interconnect structure according to an aspect includes a dielectric layer, a conductive interconnect on the dielectric layer, and a graphene cap layer on the conductive interconnect. Since the graphene cap layer includes graphene quantum dots and has a carbon content of 80 at % or more and an oxygen content of 15 at % or less, resistance of the conductive interconnect may be reduced. Simultaneously, it is possible to provide an interconnect structure capable of limiting and/or preventing the deterioration of electrical characteristics by maintaining the dielectric constant of the dielectric layer without changing the composition of the graphene cap layer.

Figure 14:
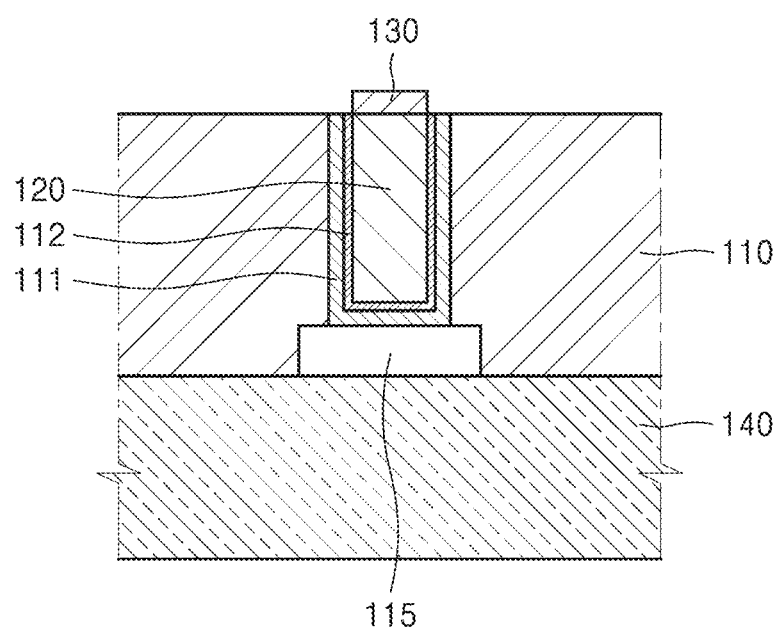
FIG. 14 is a schematic cross-sectional view of an electronic device including an interconnect structure according to an embodiment.

FIG. 14 is a schematic cross-sectional view of an electronic device including an interconnect structure according to an embodiment.

Referring to FIG. 14, an electronic device may be similar to the interconnect structure described above in FIG. 4, except the conductive interconnect 120 may be formed on a device element 115. The device element 115 and the dielectric layer 110 may be formed on a substrate 140. The device element 115 may be an electrode or other part of a circuit structure. The circuit structure may be a capacitor, a transistor, a diode, a resistor, or a wire, but is not limited thereto. In some embodiments, the liner 111 and/or barrier layer 112 in FIG. 14 may be omitted.

Although the graphene cap layer 130 in FIG. 14 has a width that is equal to a width of the conductive interconnect 120, example embodiments are not limited thereto. In other embodiments, the graphene cap layer 130 may extend on to an upper surface of the dielectric layer 110, an upper surface of the barrier layer 112, an upper surface of the liner layer 111 like the graphene cap layer 130 in FIGS. 1 and 5 to 7 described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. An interconnect structure comprising:
a dielectric layer;
a conductive interconnect on the dielectric layer; and
a graphene cap layer on the conductive interconnect,
wherein the graphene cap layer contains graphene quantum dots including spherical grains, and
the graphene cap layer has a carbon content of 80 at % to 95 at % and an oxygen content of 5 at % to 15 at %, wherein
the dielectric layer surrounds a side surface of the conductive interconnect,
the graphene cap layer is exposed on an upper surface of the conductive interconnect, and covers an entirety of an upper surface of the dielectric layer.

2. The interconnect structure of claim 1, wherein
wherein the graphene quantum dots have a ratio of carbon having an $sp^2$ bond to carbon having an $sp^3$ bond of 1 or more.

3. The interconnect structure of claim 1,
wherein the graphene quantum dots have an average grain size of about 1 nm to about 10 nm.

4. The interconnect structure of claim 1,
wherein the graphene cap layer has a thickness of about 1 nm to about 20 nm.

5. The interconnect structure of claim 1,
wherein the graphene cap layer, when measuring Raman spectra, has an intensity ratio of a D band peak to a G band peak of 2 or less.

6. The interconnect structure of claim 1,
wherein the graphene cap layer, when measuring Raman spectra has an intensity ratio of a 2D band peak to a G band peak of 0.01 or more.

7. The interconnect structure of claim 1,
wherein the conductive interconnect includes at least one metal selected from Cu, Ru, Rh, Ir, Mo, W, Pd, Pt, Co, Ta, and Ti, or an alloy thereof.

8. The interconnect structure of claim 1, wherein
a lower surface of the graphene cap layer is coplanar with the upper surface of the conductive interconnect and the upper surface of the dielectric layer.

9. The interconnect structure of claim 1, wherein
the graphene cap layer, when measuring Raman spectra, has an intensity ratio of a D band peak to a G band peak of less than 1.

10. The interconnect structure of claim 1, further comprising:
a barrier layer between the dielectric layer and the conductive interconnect.

11. The interconnect structure of claim 10, further comprising:
a liner layer between the conductive interconnect and the barrier layer.

12. The interconnect structure of claim 11, wherein
the dielectric layer surrounds side surfaces of the conductive interconnect, the liner layer, and the barrier layer, and
wherein the graphene cap layer is exposed on an upper surface of the conductive interconnect.

13. The interconnect structure of claim 1, wherein
the dielectric layer includes at least one trench formed therein
the conductive interconnect fills the at least one trench, and
the graphene cap layer is on at least part of an upper surface of the conductive interconnect.

14. The interconnect structure of claim 13,
wherein the graphene cap layer covers the upper surface of the conductive interconnect.

15. The interconnect structure of claim 1,
wherein the graphene cap layer, when measuring Raman spectra has an intensity ratio of a 2D band peak to a G band peak of 0.01 to 0.2.

16. The interconnect structure of claim 13, further comprising:
a barrier layer surrounding the conductive interconnect inside the at least one trench.

17. The interconnect structure of claim 16, further comprising:
a liner layer between the conductive interconnect and the barrier layer, wherein
the liner layer surrounds the conductive interconnect inside the at least one trench.

18. The interconnect structure of claim 17,
wherein the graphene cap layer covers the upper surface of the conductive interconnect.

19. The interconnect structure of claim 17,
wherein the graphene cap layer covers upper surfaces of the liner layer and the barrier layer around the conductive interconnect.

20. The interconnect structure of claim 13,
wherein the graphene cap layer directly contacts the upper surface of the conductive interconnect.

21. An electronic device comprising:
a substrate; and
the interconnect structure of claim 1 on the substrate.

22. The electronic device of claim 21,
wherein the graphene cap layer has a ratio of carbon having an sp$^2$ bond to carbon having an sp$^3$ bond of 1 or more.

23. The electronic device of claim 21, wherein
the dielectric layer includes at least one trench,
the conductive interconnect fills the at least one trench, and
the graphene cap layer is on at least part of an upper surface of the conductive interconnect.

24. The interconnect structure of claim 1,
wherein the graphene cap layer, when measuring Raman spectra has an intensity ratio of a D band peak to a G band peak of about 0.7.

25. A method of manufacturing an interconnect structure, the method comprising:
preparing a dielectric layer;
placing a conductive interconnect on the dielectric layer;
applying a graphene-containing composition onto the conductive interconnect; and
drying the graphene-containing composition to form a graphene cap layer on the conductive interconnect,
wherein the graphene cap layer contains graphene quantum dots including spherical grains, and
the graphene cap layer has a carbon content of 80 at % to 95 at % and an oxygen content of 5 at % to 15 at %, wherein
the dielectric layer surrounds a side surface of the conductive interconnect,
the graphene cap layer is exposed on an upper surface of the conductive interconnect, and covers an entirety of an upper surface of the dielectric layer.

26. The method of claim 25,
wherein the graphene-containing composition includes graphene quantum dots,
each of graphene quantum dots at an end thereof has at least one functional group selected from a hydroxyl group, an epoxy group, a carboxyl group, an amine group, and an amide group.

27. The method of claim 26,
wherein the graphene quantum dots are dispersed in water, an organic polar solvent, or a combination thereof.

28. The method of claim 25 further comprising:
performing a heat treatment at a temperature of 400° C. or less in the applying the graphene-containing composition or the drying the graphene-containing composition to form the graphene cap layer.

29. An interconnect structure comprising:
a dielectric layer;
a conductive interconnect on the dielectric layer; and
a graphene cap layer on the conductive interconnect,
wherein the graphene cap layer contains graphene quantum dots including spherical grains, and
the graphene cap layer has a carbon content of 80 at % to 95 at % and an oxygen content of 5 at % to 15 at %, wherein
the dielectric layer surrounds a side surface of the conductive interconnect,
the graphene cap layer is exposed on an upper surface of the conductive interconnect, and covers an upper surface of the dielectric layer.

30. The interconnect structure of claim 29, wherein
a lower surface of the graphene cap layer is coplanar with the upper surface of the conductive interconnect and the upper surface of the dielectric layer.

31. The interconnect structure of claim 29, wherein
the graphene cap layer, when measuring Raman spectra, has an intensity ratio of a D band peak to a G band peak of less than 1.

32. The interconnect structure of claim 29,
wherein the graphene cap layer, when measuring Raman spectra has an intensity ratio of a D band peak to a G band peak of about 0.7.

* * * * *